US008459756B2

(12) United States Patent
Linhares, Jr. et al.

(10) Patent No.: US 8,459,756 B2
(45) Date of Patent: Jun. 11, 2013

(54) ADJUSTABLE BLANKING PANEL

(75) Inventors: Manuel D. Linhares, Jr., Coventry, RI (US); Carl Cotulli, Franklin, MA (US)

(73) Assignee: Eaton Corporation, Cleveland, OH (US)

( * ) Notice: Subject to any disclaimer, the term of this patent is extended or adjusted under 35 U.S.C. 154(b) by 99 days.

(21) Appl. No.: 13/005,811

(22) Filed: Jan. 13, 2011

(65) Prior Publication Data
US 2011/0175505 A1    Jul. 21, 2011

Related U.S. Application Data

(60) Provisional application No. 61/296,309, filed on Jan. 19, 2010.

(51) Int. Cl.
A47B 47/00    (2006.01)

(52) U.S. Cl.
USPC .......................................... 312/265.3; 211/26

(58) Field of Classification Search
USPC   312/223.1, 265.1–265.6, 205, 257.1; 211/26; 454/184; 174/50; 439/501; 385/134
See application file for complete search history.

(56) References Cited

U.S. PATENT DOCUMENTS

| 3,757,934 | A |   | 9/1973  | Taub |  |
|-----------|---|---|---------|------|--|
| 3,765,344 | A |   | 10/1973 | Ferdinand et al. |  |
| 3,773,399 | A | * | 11/1973 | Sulcek | 312/204 |
| 3,851,938 | A | * | 12/1974 | McCowan et al. | 312/117 |
| 4,500,146 | A | * | 2/1985  | Peterson | 312/257.1 |
| 4,713,949 | A | * | 12/1987 | Wilcox | 68/235 R |
| 5,889,648 | A | * | 3/1999  | Heavirland et al. | 361/600 |
| 6,017,104 | A | * | 1/2000  | Foschino | 312/205 |
| 6,278,606 | B1| * | 8/2001  | Schmitt et al. | 361/679.35 |
| 6,496,364 | B1| * | 12/2002 | Medin et al. | 361/679.4 |
| 6,629,614 | B2| * | 10/2003 | Jordan | 211/26 |
| 6,758,353 | B2|   | 7/2004  | Orr |  |
| 7,438,638 | B2|   | 10/2008 | Lewis, II et al. |  |
| 7,506,768 | B2|   | 3/2009  | Rassmussen et al. |  |
| 7,645,001 | B2| * | 1/2010  | Harris | 312/205 |
| 7,839,635 | B2| * | 11/2010 | Donowho et al. | 361/692 |
| 7,957,139 | B2| * | 6/2011  | Davis et al. | 361/690 |
| 7,987,799 | B2| * | 8/2011  | Lange et al. | 108/102 |
| 7,988,244 | B2| * | 8/2011  | Haws, Jr. | 312/108 |
| 7,999,183 | B2| * | 8/2011  | Garza et al. | 174/100 |
| 2007/0171613 | A1 |   | 7/2007  | McMahan et al. |  |
| 2008/0203863 | A1 | * | 8/2008  | Beirne et al. | 312/223.1 |
| 2008/0266789 | A1 | * | 10/2008 | Hruby et al. | 361/692 |

(Continued)

OTHER PUBLICATIONS

International Search Report mailed Mar. 9, 2011 in corresponding application PCT/US2011/021084.

Primary Examiner — James O Hansen
Assistant Examiner — Hiwot Tefera
(74) Attorney, Agent, or Firm — Mirick, O'Connell, DeMallie & Lougee, LLP

(57) ABSTRACT

Adjustable blanking panels for use with equipment racks and enclosures to cover or fill in vacant sections of the rack or enclosure, to prevent the circular flow and reentry of high temperature air into the intake of electrical and computer equipment. The adjustable blanking panels include a generally rectangular base frame that defines opposing left and right side channels, and a generally rectangular shield that is adapted to be inserted into the side channels and slide relative to the base frame, to adjust the height of the panel to the size of the vacant section. The adjustable blanking panel may further include a lip that may be used to raise or lower the shield.

16 Claims, 6 Drawing Sheets

U.S. PATENT DOCUMENTS

2008/0308515 A1* 12/2008 Lange et al. .................. 211/134
2008/0316702 A1* 12/2008 Donowho et al. ............. 361/692
2008/0316703 A1* 12/2008 Donowho et al. ............. 361/695
2009/0059486 A1   3/2009 Taylor

* cited by examiner

ADJUSTABLE BLANKING PANEL

CROSS-REFERENCE TO RELATED APPLICATION

This application claims priority to U.S. Provisional Patent Application Ser. No. 61/296,309 entitled "Adjustable Blanking Panel," filed on Jan. 19, 2010. The entire contents of the priority application are expressly incorporated by reference herein.

FIELD OF THE INVENTION

The invention relates to panels for use with cabinets and enclosures that house rack-mounted electrical and computer equipment. Specifically, the invention relates to height-adjustable panels for preventing the reentry of heated exhaust air into the air intake of the electrical or computer equipment.

BACKGROUND OF THE INVENTION

Electrical and computer equipment, such as computer servers, data storage devices, and power supplies, are often mounted on a rack or frame using mounting members such as shelves, rails and/or brackets. As is well known, these electronic components generate substantial heat that must be dissipated in order to maintain the devices in proper working order and prevent damage and possible failure. Most electronic device manufacturers require air of a specific temperature range to be drawn into the front of the device, passed over the internal components where the heat is exchanged, and exhausted out of the back of the device. Cabinets and enclosures, as well as the data centers or rooms that house the cabinets, are typically set up to accommodate this "front to back" air flow requirement.

However, properly exhausting the heated air generated within the cabinets becomes increasing more difficult as more powerful equipment is installed in cabinets, and as the cabinets become more densely packed with electronic equipment. As a result, the inlet temperature of the air drawn into the devices is more likely to exceed the recommended operating range of the device. The result is an upward trend in the failure of these electronic devices. Such equipment failures are more than an inconvenience, as some failures may result in interruptions to mission critical systems and communications, such as those used for example in emergency response management, aviation and flight control, process control, and finance.

In many cases, however, the racks or frames are not fully populated with components, resulting in vacant sections. This empty space may result in warm air from the back being drawn into the air intake at the front, which does not permit cooler air to be drawn into the electronic equipment, and may cause the equipment to overheat.

One of the most common solutions to this problem is to attach blanking panels to the rails or brackets of the enclosure to function as a barrier and to block or fill in these vacant sections. Prior art blanking panels are typically manufactured and sold with fixed heights, ranging from one Rack Unit (RU) to four or more RUs. When the configuration of equipment inside a rack or enclosure changes, however, these fixed-sized blanking panels may need to be removed and replaced with panels of a different size. In many cases, there is no immediate further use for the panel that has been removed.

There is a need in the art, then, for a blanking panel that can be adjusted to different heights to allow enclosures and racks to be reconfigured without having to remove and replace a fixed-height blanking panel. In addition to the cost savings that may be realized by minimizing the number and different sizes of blanking panels that must be installed in any one cabinet or that need to be kept on hand for future use, a height-adjustable blanking panel may also reduce the amount of labor hours expended when a cabinet or enclosure is reconfigured.

SUMMARY OF THE INVENTION

The invention disclosed herein provides height-adjustable panels and systems for preventing the circular flow and reentry of high temperature air into the air intake of the electrical or computer equipment.

In a preferred embodiment, an assembly for use with an enclosure, where the enclosure comprises a pair of mounting rails, and each mounting rail defining a plurality of mounting holes, comprises a generally rectangular base member defining a top, a bottom, opposing left and right side channels, and a pair of mounting holes; and a generally rectangular sliding member defining a top, a bottom, opposing left and right sides, and a pair of mounting holes; where the base member mounting holes are sized and shaped to accommodate a first pair of fasteners inserted through the base member mounting holes and through a first pair of mounting rail mounting holes, to removably couple the base member to the pair of mounting rails; where the sliding member mounting holes are sized and shaped to accommodate a second pair of fasteners inserted through the sliding member mounting holes and through a second pair of mounting rail mounting holes, to removably couple the sliding member to the pair of mounting rails; and where the left and rights sides of the sliding member are located within the left and right side channels of the base member, respectively, such that the sliding member is adapted to slide relative to the base member.

In an aspect, the top of the sliding member defines an upper lip, adapted to allow a user to raise or lower the sliding member relative to the base member. In another aspect, the bottom of the base member defines a lower lip, such that the bottom of the sliding member contacts and rests upon the lower lip when the sliding member is fully retracted. In yet another aspect, the top of the sliding member defines at least one upper tab, such that the upper tab contacts and rests upon the top of the base member when the sliding member is fully retracted.

In an aspect, the left and right side channels are each defined by a first wall that is generally parallel to a front face of the base member, and a second wall that is generally perpendicular to the front face of the base member. In another aspect, the left and right side channels extend along the majority of the left and right sides, respectively, of the base member.

In an additional preferred embodiment, an assembly for use with an enclosure, where the enclosure comprises a pair of mounting rails, comprises a base frame defining a generally rectangular rear section, and opposing left and right side retaining members; where the rear section of the base frame defines opposing front and rear sides, opposing top and bottom edges, and opposing left and right side edges; where the left and right side retaining members are coupled to the left and right side edges, respectively, of the rear section; a shield defining a generally rectangular panel section; where the panel section of the shield defines opposing front and rear sides, opposing top and bottom edges, and opposing left and right side edges; and where the left and right side edges of the panel section of the shield are located within the left and right side retaining members of the base frame, respectively, such that the shield is adapted to slide relative to the base frame.

In an aspect, the base frame further defines a lower lip coupled to the bottom edge of the rear section of the base frame, such that the bottom edge of the panel section of the shield contacts and rests upon the lower lip when the shield is fully retracted. In another aspect, the bottom edge of the panel section of the shield contacts and rests upon the lower lip of the base frame when the shield is in a fully retracted position. In still another aspect, the shield further defines an upper lip coupled to the top edge of the panel section of the shield.

In an aspect, the shield further defines at least one upper tab coupled to the top edge of the panel section of the shield, such that the upper tab contacts and rests upon the top edge of the rear panel of the base frame when the shield is in a fully retracted position. In another aspect, the base frame further defines one or more mounting holes proximate the top edge of the rear panel of the base frame, for attaching the base frame to the pair of mounting rails. In still another aspect, the shield further defines one or mounting holes proximate the top edge of the panel section of the shield, for attaching the shield to the pair of mounting rails.

In an aspect, the left and right side retaining members are each defined by a first wall that is generally parallel to and spaced from the front side of the rear panel of the base frame and a second wall that is generally perpendicular to the front side of the rear panel of the base frame. In another aspect, the second walls of each of the retaining members are coupled to their corresponding front wall and to the rear section of the base frame. In still another aspect, the left and right side retaining members extend along the majority of the left and right side edges, respectively, of the rear panel of the base frame.

In an additional preferred embodiment, an enclosure for mounting electronic equipment comprises a plurality of vertical structural members defining an inner volume between the structural members; a pair of mounting rails, each mounting rail coupled to one of the vertical structural members; and an assembly coupled to the pair of mounting rails, where the assembly comprises a generally rectangular base member defining a top, a bottom, and opposing left and right side channels and a generally rectangular sliding member defining a top, a bottom, and opposing left and right sides; and where the left and rights sides of the sliding member are located within the left and right side channels, respectively, such that the sliding member is adapted to slide relative to the base member to adjustably allow access to the inner volume.

In an aspect, the base member further defines a pair of mounting holes; the sliding member further defines a pair of mounting holes; each mounting rail defines a plurality of mounting holes; the base member mounting holes are sized and shaped to accommodate a first pair of fasteners inserted through the base member mounting holes and through a first pair of mounting rail mounting holes, to removably couple the base member to the pair of mounting rails; and the sliding member mounting holes are sized and shaped to accommodate a second pair of fasteners inserted through the sliding member mounting holes and through a second pair of mounting rail mounting holes, to removably couple the sliding member to the pair of mounting rails.

In an additional preferred embodiment, a method of adjustably allowing access to an inner volume of an enclosure for mounting electronic equipment comprises providing an enclosure comprises a plurality of vertical structural members defining an inner volume between the structural members, and a pair of mounting rails, where each of the mounting rails defines a plurality of mounting holes and is coupled to at least one of the vertical structural members; providing an assembly comprising a generally rectangular base member defining a top, a bottom, opposing left and right side channels, and a pair of mounting holes, and a generally rectangular sliding member defining a top, a bottom, and opposing left and right sides; coupling the base member to the pair of mounting rails by inserting a first pair of fasteners through the base member mounting holes and through a first pair of mounting rail mounting holes; inserting the left and rights sides of the sliding member into the left and right side channels of the base member; and sliding the sliding member relative to the base member to adjust access to the inner volume of the enclosure.

In an aspect, the sliding member further defines a pair of mounting holes, and the method further comprises the step of coupling the sliding member to the pair of mounting rails by inserting a second pair of fasteners through the sliding member mounting holes and through a second pair of mounting rail mounting holes.

Embodiments of the invention may provide one or more advantages, including:

Airflow Management—allows cooled air to be utilized where needed, and prevents heated air from recirculating and damaging equipment.

Reversible Application—can be installed either top-up or bottom-up.

Adjustable Application—can be installed within multiple mounting settings and rail positions.

Modular Application—can be installed with or without various features and settings as well as in multiple arrangements and configurations.

Space/Size Adaptability—can be adapted for use with electronic equipment in a range of sizes and heights.

Material Selection—can be constructed in multiple materials to meet different cost and environment requirements.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS OF THE INVENTION

Figure 1:
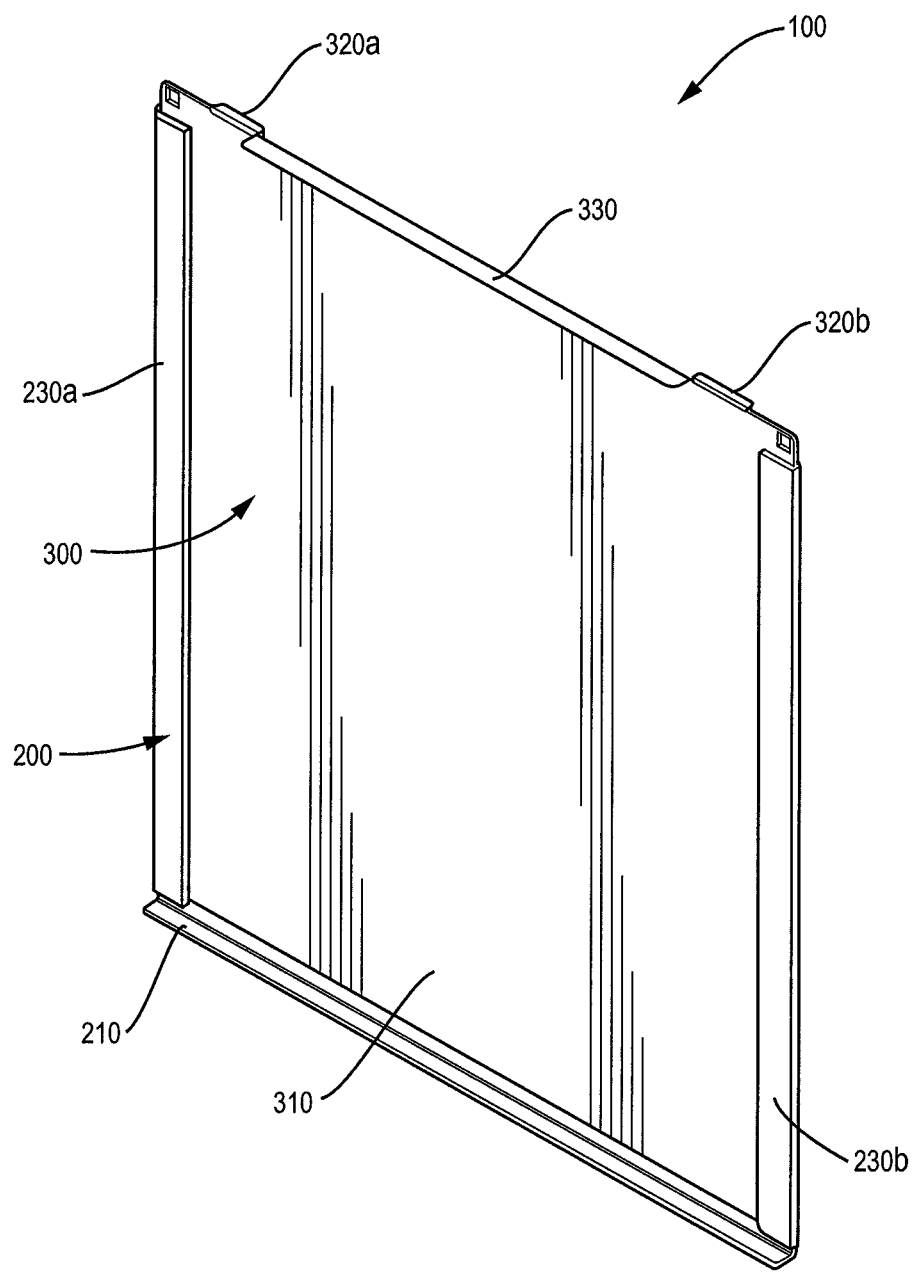
FIG. 1 is a perspective view of an adjustable blanking panel, according to a preferred embodiment of the invention.
Figure 2:
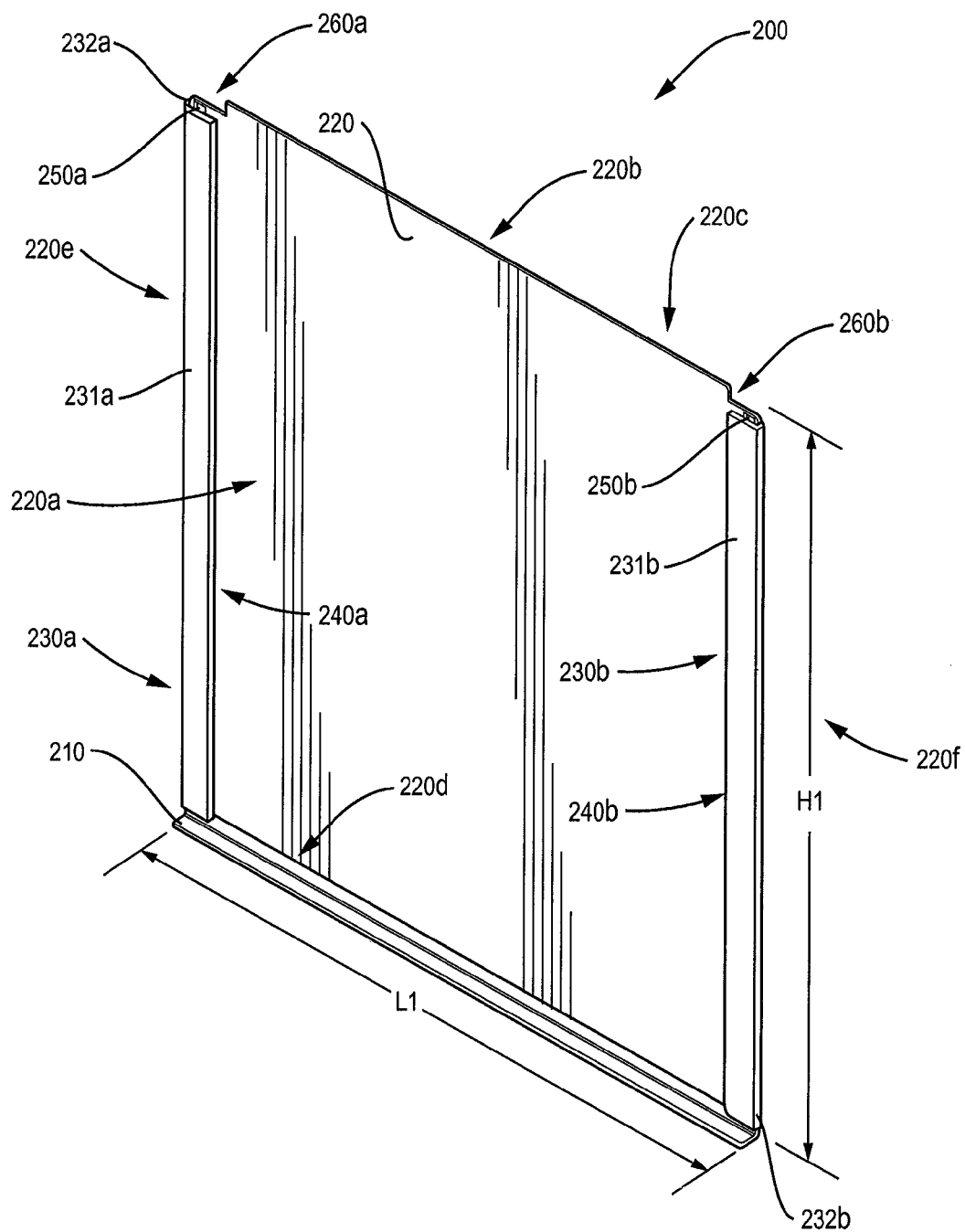
FIG. 2 is a perspective view of a base frame of the adjustable blanking panel of FIG. 1.
Figure 3:
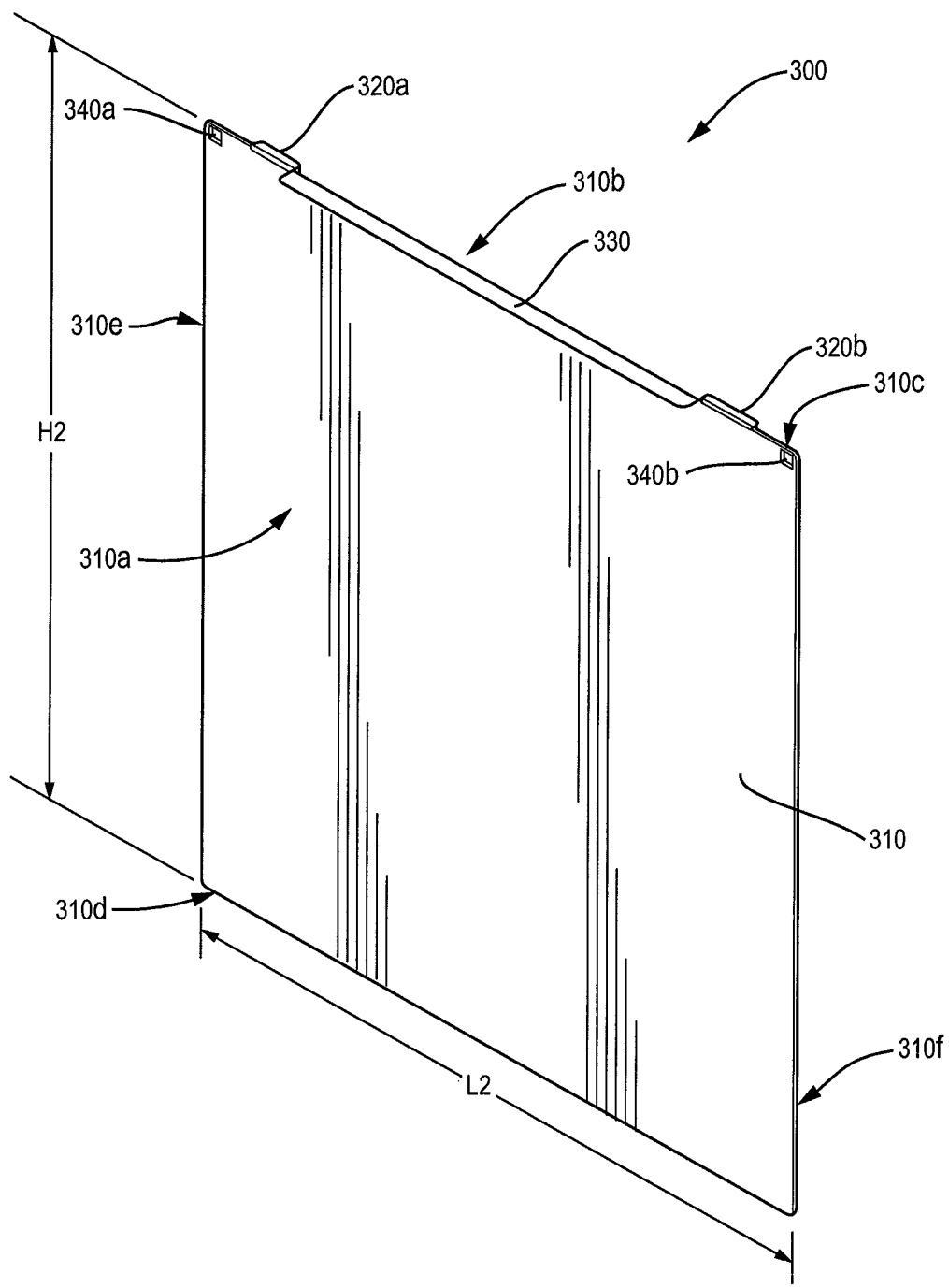
FIG. 3 is a perspective view of a shield of the adjustable blanking panel of FIG. 1.

In a preferred embodiment, and as shown in FIG. 1, adjustable blanking panel 100 comprises a base frame or base member 200, shown in detail in FIG. 2, and a shield or sliding member 300, shown in detail in FIG. 3.

With further reference to FIG. 2, in a preferred embodiment base frame 200 is generally rectangular in shape, and defines lower lip or shelf 210, rear section 220, opposing left and right side retaining members 230a and 230b, respectively, and a pair of mounting openings or holes 250a and 250b.

Rear section 220 is generally rectangular in shape and defines opposing front and rear sides 220a and 220b, respectively, opposing top and bottom edges 220c and 220d, respectively, and opposing left and right side edges 220e and 220f, respectively.

Lower lip or shelf 210 is preferably integrally coupled to the bottom edge 220d of rear section 220. Lower lip or shelf 210 is generally perpendicular to rear section 220, and extends away from the front side 220a of rear section 220. In preferred embodiments, lower lip or shelf 210 extends along substantially the entire length of bottom edge 220d. In alternate embodiments, lower lip or shelf 210 may extend along only a portion of the length of bottom edge 220d. In additional embodiments, lower lip or shelf 210 may be comprised of a plurality of non-contiguous segments.

Opposing left and right side retaining members 230a and 230b, respectively, are substantially identical, mirror-image structures that are preferably integrally coupled to the left and right side edges 220e and 220f, respectively, of rear section 220. Side retaining members 230a and 230b each define a first wall, 231a and 231b, respectively, that is generally parallel to and spaced from rear section 220 and a second wall, 232a and 232b, respectively, that is generally perpendicular to rear section 220. Second walls 232a and 232b are preferably integrally coupled to both rear section 210 and first walls 231a and 231b, respectively.

In preferred embodiments, side retaining members 230a and 230b extend along substantially the entire height of side edges 220e and 220f, respectively. In alternate embodiments, side retaining members 230a and 230b may extend along only a portion of the height of side edges 220e and 220f. In additional embodiments, one or both of side retaining members 230a and 230b may be comprised of a plurality of non-contiguous segments.

As is shown in FIG. 2, the arrangement of first wall 231a, second wall 232a and front side 220a of rear section 220 forms a first channel 240a, and the arrangement of first wall 231b, second wall 232b and front side 220a of rear section 220 forms a second channel 240b. In preferred embodiments, first and second channels 240a and 240b are configured to accommodate the left and right side edges 310e and 310f, respectively, of shield 300, as described below.

In preferred embodiments, rear section 220 further defines a pair of cut-outs or notches 260a and 260b, located proximate the top edge 220c, that are configured to facilitate the installation of base frame 200, as described below. Cut-out or notch 260a is located proximate left side edge 220e and cut-out or notch 260b is located proximate right side edge 260b. Cut-outs or notches 260a and 260b are preferably located above mounting openings or holes 250a and 250b, respectively.

With further reference to FIG. 3, in a preferred embodiment, shield 300 is generally rectangular in shape, and defines panel section 310, upper lip or shelf 330, upper tabs 320a and 320b, and mounting openings or holes 340a and 340b.

Panel section 310 is generally rectangular in shape and defines opposing front and rear sides 310a and 310b, respectively, opposing top and bottom edges 310c and 310d, respectively, and opposing left and right side edges 310e and 310f, respectively.

Upper lip or shelf 330 is preferably integrally coupled to the top edge 310c of panel section 310. Upper lip or shelf 330 is generally perpendicular to panel section 310, and extends away from the front side 310a of panel section 310. In preferred embodiments, upper lip or shelf 330 extends along the majority of the center portion of top edge 310c.

Upper tabs 320a and 320b are preferably integrally coupled to the top edge 300c of panel section 310 and are located on either side of upper lip or shelf 330. Upper tabs 320a and 320b are generally perpendicular to panel section 310, but extend in the opposite direction from upper lip 330, away from the rear side 310b of panel section 310.

Figure 4A:
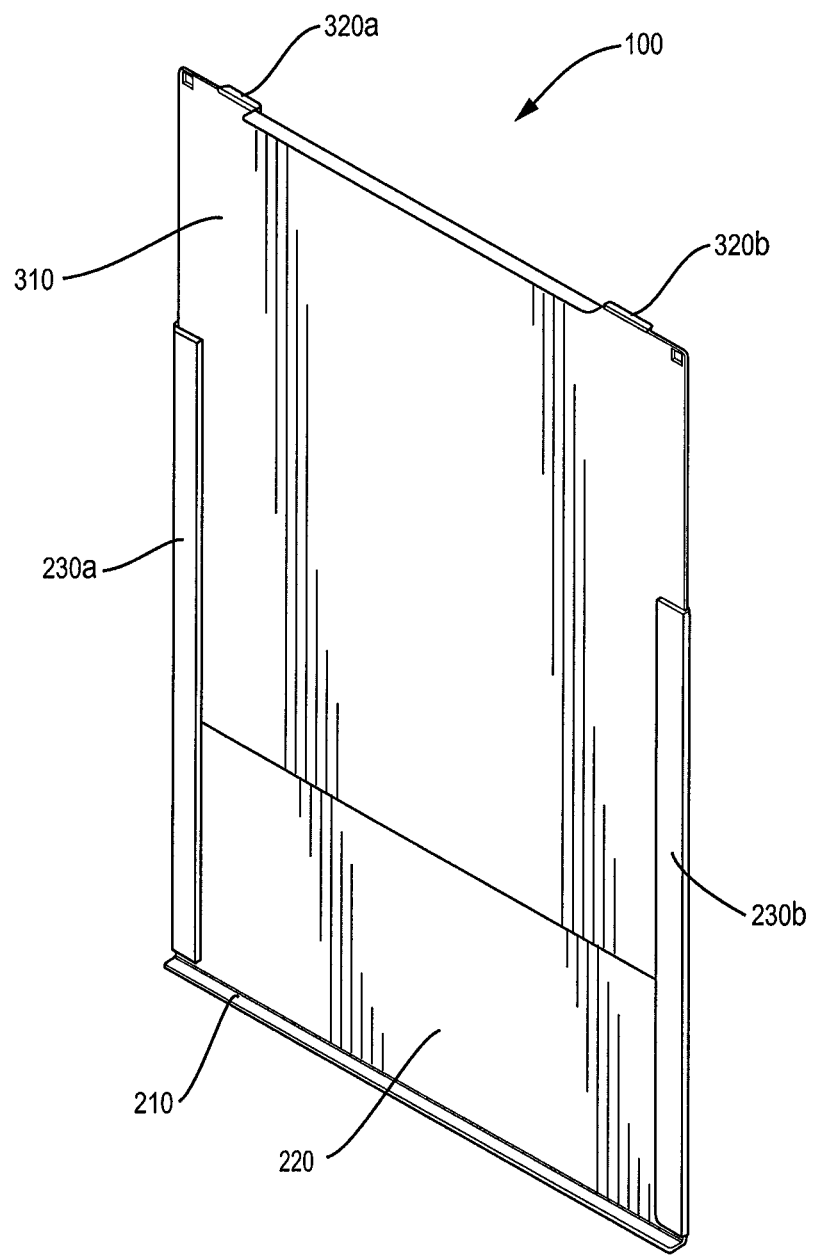
FIGS. 4A and 4B illustrate a preferred manner in which the shield of the adjustable blanking panel of FIG. 1 may be adjusted relative to the base frame of FIG. 1.
Figure 4B:
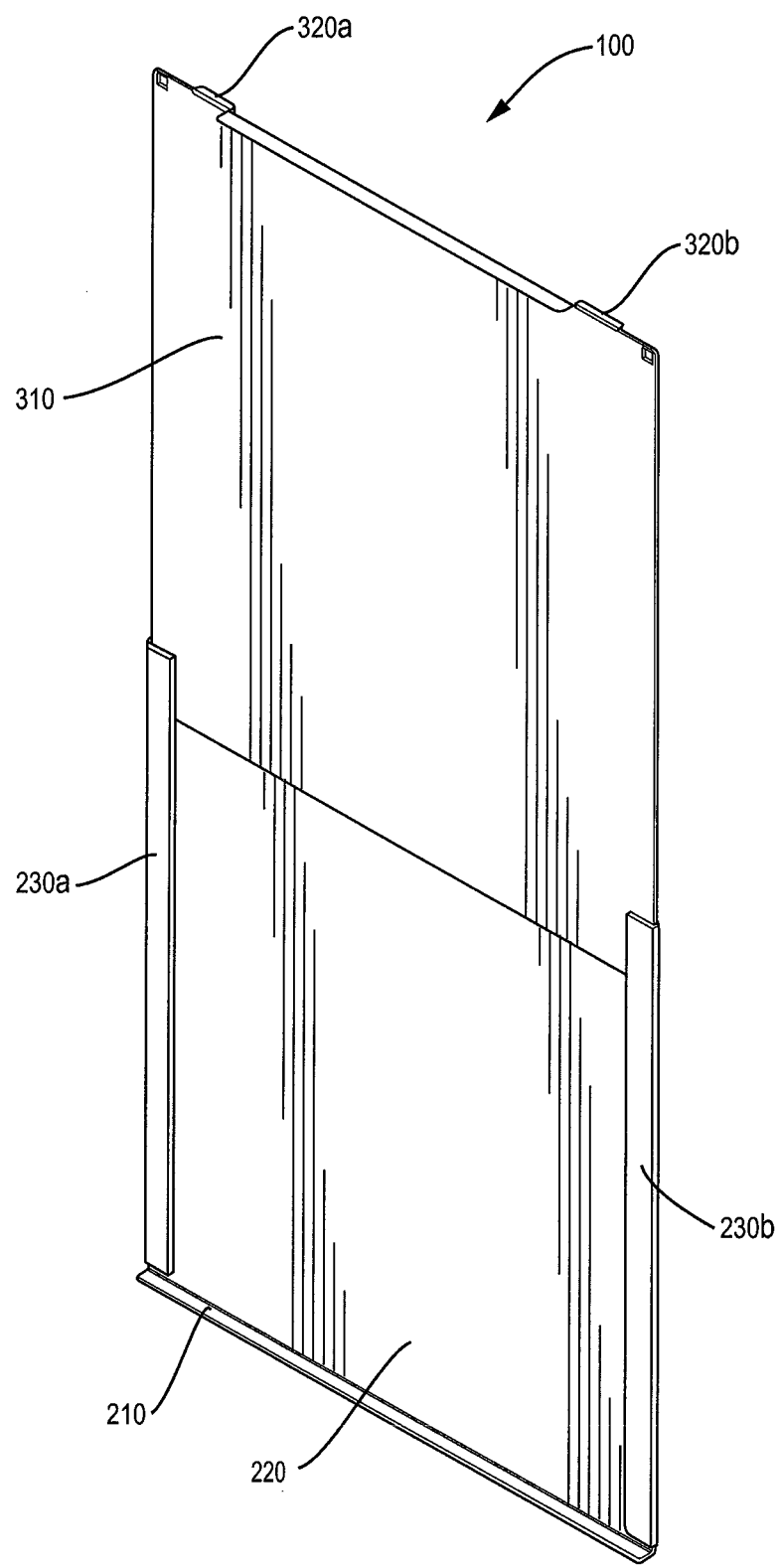

In a preferred method of use, as shown in FIGS. 1, 4A and 4B, the side edges 310e and 310f of panel section 310 of shield 300 are inserted into channels 240a and 240b, respectively, of base frame 200, such that base frame 200 and shield 300 are in sliding engagement with each other. Upper lip or shelf 330 may be grasped to allow a user to raise or lower shield 300 relative to base frame 200.

In FIG. 1, in one preferred method of use, adjustable blanking panel 100 is shown with shield 300 down or fully retracted/stowed, such that: (i) the bottom edge 310d of panel section 310 contacts and rests upon lower lip or shelf 210 of base frame 200; and (ii) upper tabs 320a and 320b of shield 300 contact and rest upon the top edge 220c of panel section 310 of base frame 200. In FIG. 4A, adjustable blanking panel 100 is shown with shield 300 partially extended, such that a portion of panel section 310 is visible from the front. In FIG. 4B, adjustable blanking panel 100 is shown with shield 300 fully extended.

Figure 5:
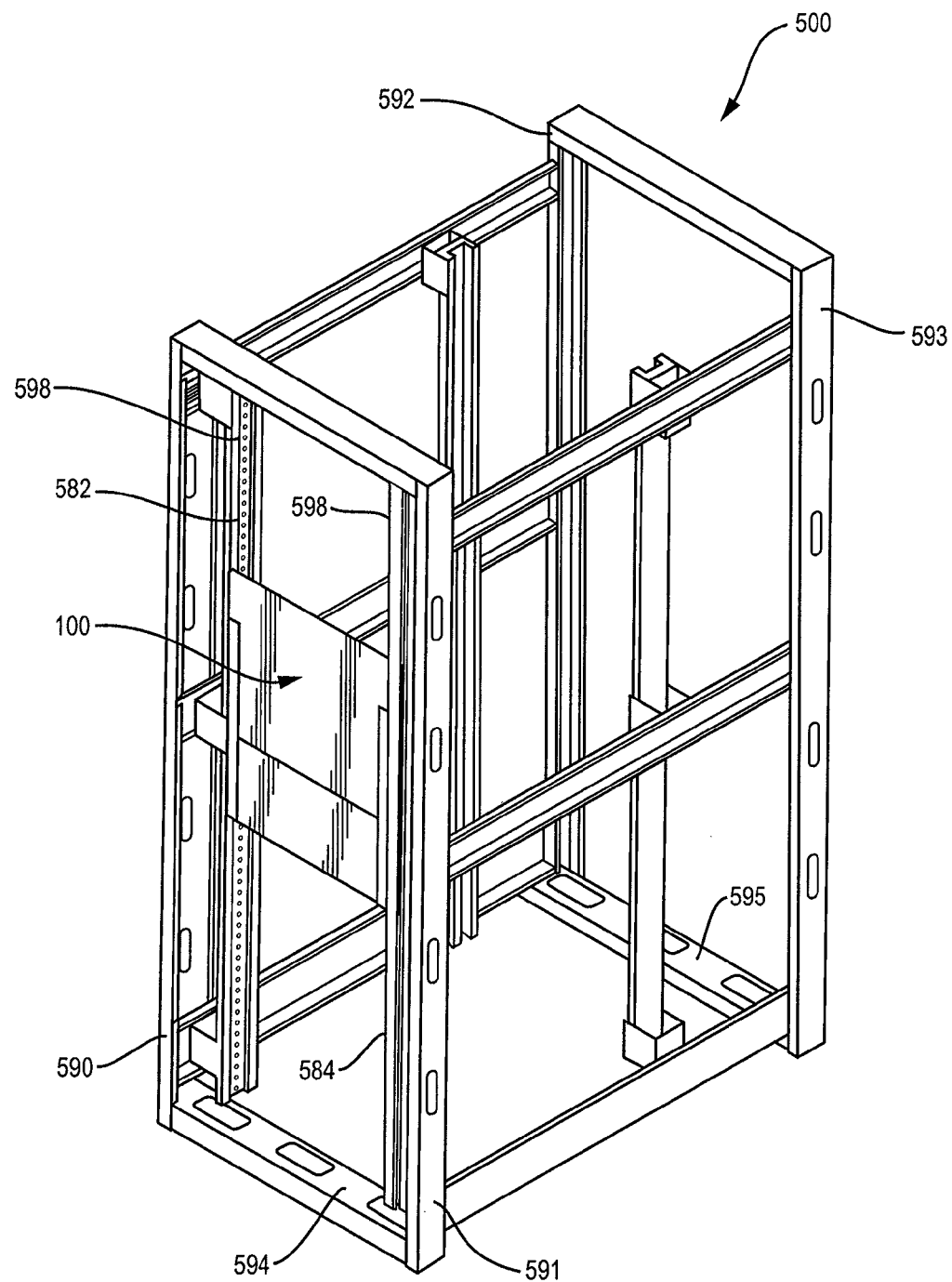
FIG. 5 illustrates a preferred manner in which the adjustable blanking panel of FIG. 1 may be mounted in an enclosure.

As shown in FIG. 5, adjustable blanking panel 100 may be mounted in enclosure 500. Enclosure 500 comprises front enclosure structural members 590 and 591, rear enclosure structural members 592 and 593, and horizontal enclosure structural members 594 and 595. The structural members together define an inner volume for the mounting of electrical equipment. Enclosure 500 further comprises rails 582 and 584, located proximate the front of enclosure 500. Rails 582 and 584 comprise a plurality of mounting openings or holes 598 along their length.

In a preferred embodiment, base frame 200, at mounting holes 250a and 250b, may be removably coupled or mounted to rails 582 and 584, at a pair of mounting holes 598 via screws or other fasteners inserted through the two sets mounting holes. Shield 300, at mounting holes 340a and 340b, may be adjusted and similarly removably coupled or mounted to mounting rails 582 and 584, at a pair of mounting holes 598 via screws or other fasteners inserted through the two sets of mounting holes. Note that, in alternate preferred embodiments, adjustable blanking panel 100 may be mounted upside down.

In a preferred embodiment, base frame 200 and shield 300 are constructed of bent and formed sheet metal, although this is not a limitation of the invention.

The dimensions of a preferred embodiment of adjustable blanking panel 100 are listed below:

| Reference | Description | Preferred Dimension |
| --- | --- | --- |
| H1 | Height of base frame 200 | (Total RU)/2 + 2/3RU |
| H2 | Height of shield 300 | (Total RU)/2 + 1RU |
| L1 | Length of base frame 200/Length of lower lip or shelf 210 | 19 inches |
| L2 | Length of shield 300 | 18.8 inches |

The particular construction, materials and dimensions described herein are not limitations of the invention, as other constructions can accomplish the invention described herein.

Although specific features of the invention are shown in some figures and not others, this is for convenience only, as some features may be combined with any or all of the other features in accordance with the invention.

Recitation ranges of values herein are merely intended to serve as a shorthand method of referring individually to each separate value falling within the range, unless otherwise indicated herein, and each separate value is incorporated into the specification as if it were individually recited herein.

The use of any and all examples, or exemplary language (e.g., "such as") provided herein, is intended merely to better illustrate the invention and does not pose a limitation on the scope of the invention.

A variety of modifications to the embodiments described herein will be apparent to those skilled in the art from the disclosure provided herein. Thus, the invention may be embodied in other specific forms without departing from the spirit or essential attributes thereof.

What is claimed is:

1. An assembly for use with an enclosure, the enclosure comprising a pair of mounting rails, each mounting rail defining a plurality of mounting holes, the assembly comprising:
    a generally rectangular base member defining a top, a bottom, a generally rectangular rear section, and opposing left and right side channels, and
    a generally rectangular sliding member defining a top, a bottom, a generally rectangular panel section, and opposing left and right sides,
    where the left and right sides of the sliding member are located within the left and right side channels of the base member, respectively, such that the sliding member is adapted to be vertically positioned, substantially parallel to the pair of mounting rails, between a first height relative to the base member and a second height relative to the base member to adjustably allow access to the inner volume and to adjust a flow of air into the enclosure;
    where the base member further defines a pair of mounting holes within the rear section of the base frame, the rear section of the base member defining a plane, the pair of the mounting holes located within the plane defined by the rear section;
    where the sliding member further defines a pair of mounting holes within the panel section of the sliding member, the panel section being substantially parallel to the rear section of the base frame, the panel section of the sliding member defines a plane, the pair of the mounting holes located within the plane defined by the panel section of the sliding member;
    where each mounting rail defines a plurality of mounting holes;
    where the base member mounting holes are sized and shaped to accommodate a first pair of fasteners inserted through the base member mounting holes and through a first pair of mounting rail mounting holes, to removably couple the base member to the pair of mounting rails; and
    where the sliding member mounting holes are sized and shaped to accommodate a second pair of fasteners inserted through the sliding member mounting holes and through a second pair of mounting rail mounting holes, to removably couple the sliding member to the pair of mounting rails.

2. The assembly of claim 1, where the top of the sliding member defines an upper lip, adapted to allow a user to raise or lower the sliding member relative to the base member.

3. The assembly of claim 1, where the bottom of the base member defines a lower lip, such that the bottom of the sliding member contacts and rests upon the lower lip when the sliding member is fully retracted.

4. The assembly of claim 1, where the top of the sliding member defines at least one upper tab, such that the upper tab contacts and rests upon the top of the base member when the sliding member is fully retracted.

5. The assembly of claim 1, where the left and right side channels are each defined by a first wall that is generally parallel to a front face of the base member, and a second wall that is generally perpendicular to the front face of the base member.

6. The assembly of claim 1, where the left and right side channels extend along the majority of the left and right sides, respectively, of the base member.

7. An assembly for use with an enclosure, the enclosure comprising a pair of mounting rails, the assembly comprising:
    a base frame defining a generally rectangular rear section, and opposing left and right side retaining members;
    where the rear section of the base frame defines opposing front and rear sides, opposing top and bottom edges, and opposing left and right side edges;
    where the left and right side retaining members are coupled to the left and right side edges, respectively, of the rear section;
    a shield defining a generally rectangular panel section;
    where the panel section of the shield defines opposing front and rear sides, opposing top and bottom edges, and opposing left and right side edges; and
    where the left and right side edges of the panel section of the shield are located within the left and right side retaining members of the base frame, respectively, such that the shield is adapted to be vertically positioned, substantially parallel to the pair of mounting rails, between a first height relative to the base frame and a second height relative to the base frame to adjust a flow of air into the enclosure;
    where the shield further defines one or more mounting holes within and proximate the top edge of the panel section of the shield, for attaching the shield to the pair of mounting rails, the panel section being substantially parallel to the rear section of the base frame, the panel section of the shield defining a plane, the one or more mounting holes located within the plane defined by the panel section of the shield;
    where the base frame further defines one or more mounting holes proximate the top edge of the rear section of the base frame, for attaching the base frame to the pair of mounting rails, the rear section of the base frame defining a plane, the one or more mounting holes located within the plane defined by the rear section;
    where each mounting rail defines one or more mounting holes;
    where the base frame mounting holes are sized and shaped to accommodate a first pair of fasteners inserted through the base frame mounting holes and through a first pair of mounting rail mounting holes, to removably couple the base frame to the pair of mounting rails; and
    where the shield mounting holes are sized and shaped to accommodate a second pair of fasteners inserted through the shield mounting holes and through a second pair of mounting rail mounting holes, to removably couple the shield to the pair of mounting rails.

8. The assembly of claim 7, where the base frame further defines a lower lip coupled to the bottom edge of the rear section of the base frame, such that the bottom edge of the panel section of the shield contacts and rests upon the lower lip when the shield is fully retracted.

9. The assembly of claim 8, where the bottom edge of the panel section of the shield contacts and rests upon the lower lip of the base frame when the shield is in a fully retracted position.

10. The assembly of claim 7, where the shield further defines an upper lip coupled to the top edge of the panel section of the shield.

11. The assembly of claim 7, where the shield further defines at least one upper tab coupled to the top edge of the panel section of the shield, such that the upper tab contacts and rests upon the top edge of the rear section of the base frame when the shield is in a fully retracted position.

12. The assembly of claim 7, where the left and right side retaining members are each defined by a first wall that is generally parallel to and spaced from the front side of the rear section of the base frame and a second wall that is generally perpendicular to the front side of the rear section of the base frame.

13. The assembly of claim 12, where the second walls of each of the retaining members are coupled to their corresponding first walls and to the rear section of the base frame.

14. The assembly of claim 7, where the left and right side retaining members extend along the majority of the left and right side edges, respectively, of the rear section of the base frame.

15. An enclosure for mounting electronic equipment, comprising:
 a plurality of vertical structural members defining an inner volume between the structural members;
 a pair of mounting rails, each mounting rail coupled to one of the vertical structural members; and
 an assembly coupled to the pair of mounting rails, where the assembly comprises:
  a generally rectangular base member defining a top, a bottom, a generally rectangular rear section, and opposing left and right side channels, and
  a generally rectangular sliding member defining a top, a bottom, a generally rectangular panel section, and opposing left and right sides; and
 where the left and right sides of the sliding member are located within the left and right side channels, respectively, such that the sliding member is adapted to be vertically positioned, substantially parallel to the pair of mounting rails, between a first height relative to the base member and a second height relative to the base member to adjustably allow access to the inner volume and to adjust a flow of air into the enclosure;
 where the base member further defines a pair of mounting holes within the rear section of the base frame, the rear section of the base member defining a plane, the pair of the mounting holes located within the plane defined by the rear section;
 where the sliding member further defines a pair of mounting holes within the panel section of the sliding member, the panel section being substantially parallel to the rear section of the base frame, the panel section of the sliding member defines a plane, the pair of the mounting holes located within the plane defined by the panel section of the sliding member;
 where each mounting rail defines a plurality of mounting holes;
 where the base member mounting holes are sized and shaped to accommodate a first pair of fasteners inserted through the base member mounting holes and through a first pair of mounting rail mounting holes, to removably couple the base member to the pair of mounting rails; and
 where the sliding member mounting holes are sized and shaped to accommodate a second pair of fasteners inserted through the sliding member mounting holes and through a second pair of mounting rail mounting holes, to removably couple the sliding member to the pair of mounting rails.

16. A method of adjustably allowing access to an inner volume of an enclosure for mounting electronic equipment, comprising:
 providing an enclosure comprising
  a plurality of vertical structural members defining an inner volume between the structural members, and
  a pair of mounting rails, where each of the mounting rails defines a plurality of mounting holes and is coupled to at least one of the vertical structural members;
 providing an assembly comprising
  a generally rectangular base member defining a top, a bottom, a generally rectangular rear section, opposing left and right side channels, and a pair of mounting holes within the rear section of the base frame, and
  a generally rectangular sliding member defining a top, a bottom, a generally rectangular panel section, and opposing left and right sides and a pair of mounting holes within the panel section of the sliding member;
 coupling the base member to the pair of mounting rails by inserting a first pair of fasteners through the base member mounting holes and through a first pair of mounting rail mounting holes;
 inserting the left and rights sides of the sliding member into the left and right side channels of the base member;
 sliding the sliding member vertically and substantially parallel to the pair of mounting rails between a first height relative to the base member and a second height relative to the base member to adjust access to the inner volume of the enclosure and to adjust a flow of air into the enclosure; and
 coupling the sliding member to the pair of mounting rails by inserting a second pair of fasteners through the sliding member mounting holes and through a second pair of mounting rail mounting holes;
 where the rear section of the base member defines a plane and each of the base member mounting holes is located within the plane defined by the rear section;
 where the panel section of the sliding member is substantially parallel to the rear section of the base frame, the panel section of the sliding member defines a plane, and each of the sliding member mounting holes is located within the plane defined by the panel section of the sliding member.

* * * * *